(12) United States Patent
Yamada et al.

(10) Patent No.: US 8,709,871 B2
(45) Date of Patent: Apr. 29, 2014

(54) STACKED TYPE SEMICONDUCTOR MEMORY DEVICE AND CHIP SELECTION CIRCUIT

(76) Inventors: Junji Yamada, Tokyo (JP); Hiroaki Ikeda, Tokyo (JP); Kayoko Shibata, Tokyo (JP); Yoshihiko Inoue, Tokyo (JP); Hitoshi Miwa, Tokyo (JP); Tatsuya Ijima, Tokyo (JP)

(*) Notice: Subject to any disclaimer, the term of this patent is extended or adjusted under 35 U.S.C. 154(b) by 9 days.

(21) Appl. No.: 13/293,897

(22) Filed: Nov. 10, 2011

(65) Prior Publication Data

US 2012/0122251 A1  May 17, 2012

Related U.S. Application Data

(63) Continuation of application No. 11/634,144, filed on Dec. 6, 2006, now Pat. No. 8,076,764.

(30) Foreign Application Priority Data

Dec. 6, 2005 (JP) ................................ 2005-352692

(51) Int. Cl.
*H01L 21/66* (2006.01)

(52) U.S. Cl.
USPC .............. 438/109; 438/15; 438/106; 438/107

(58) Field of Classification Search
USPC .................................................. 257/686, 503
See application file for complete search history.

(56) References Cited

U.S. PATENT DOCUMENTS

| | | |
|---|---|---|
| 3,946,219 A | 3/1976 | Lucas |
| 5,708,298 A | 1/1998 | Masayuki et al. |
| 5,761,609 A | 6/1998 | Chen |
| 5,928,343 A | 7/1999 | Farmwald et al. |
| 6,141,245 A | 10/2000 | Bertin et al. |
| 6,239,495 B1 | 5/2001 | Sakui et al. |
| 6,601,199 B1 | 7/2003 | Fukuda et al. |
| 6,624,506 B2 | 9/2003 | Sasaki et al. |
| 6,740,981 B2 | 5/2004 | Hosomi |
| 6,791,175 B2 | 9/2004 | Matsuo et al. |

(Continued)

FOREIGN PATENT DOCUMENTS

| | | |
|---|---|---|
| JP | 2000-049277 | 2/2000 |
| JP | 2000-133000 | 5/2000 |

(Continued)

OTHER PUBLICATIONS

Chinese Notification of Reasons for Refusal issued in Patent Application No. CN 200610164162.4, dated on Jun. 6, 2008.

(Continued)

*Primary Examiner* — Colleen Matthews
*Assistant Examiner* — William Harriston

(57) ABSTRACT

A stacked type semiconductor memory device of having a structure in which a plurality of semiconductor chips is stacked and a desired semiconductor chip can be selected by assigning a plurality of chip identification numbers different from each other are individually assigned to the plurality of semiconductor chips comprising: a plurality of operation circuits which is connected in cascade in a stacking order of the plurality of semiconductor chips and outputs the plurality of identification numbers different from each other by performing a predetermined operation; and a plurality of comparison circuits which detects whether or not each the identification number and a chip selection address commonly connected to each the semiconductor chip are equal to each other by comparing them.

11 Claims, 9 Drawing Sheets

(56) References Cited

U.S. PATENT DOCUMENTS

| | | |
|---|---|---|
| 6,861,738 B2 | 3/2005 | Oyama et al. |
| 7,064,443 B2 | 6/2006 | Imaoka |
| 7,102,905 B2 | 9/2006 | Funaba et al. |
| 7,119,428 B2 | 10/2006 | Tanie et al. |
| 7,123,497 B2 | 10/2006 | Matsui et al. |
| 7,215,033 B2 | 5/2007 | Lee et al. |
| 7,256,484 B2 | 8/2007 | Rapport et al. |
| 7,268,420 B2 | 9/2007 | Hirose |
| 7,317,256 B2 | 1/2008 | Williams et al. |
| 7,487,200 B1 | 2/2009 | Srinivasan |
| 2002/0036338 A1 | 3/2002 | Matsuo et al. |
| 2002/0109236 A1 | 8/2002 | Kim et al. |
| 2003/0062612 A1 | 4/2003 | Matsuo et al. |
| 2003/0206480 A1 | 11/2003 | Takahashi |
| 2005/0001306 A1 | 1/2005 | Matsuo et al. |
| 2005/0014311 A1* | 1/2005 | Hayasaka et al. ............. 438/109 |
| 2005/0082664 A1 | 4/2005 | Funaba et al. |
| 2005/0104181 A1 | 5/2005 | Lee et al. |
| 2005/0127490 A1 | 6/2005 | Black et al. |
| 2005/0139978 A1* | 6/2005 | Hirose ........................... 257/686 |
| 2005/0189639 A1 | 9/2005 | Tanie et al. |
| 2005/0263869 A1 | 12/2005 | Tanaka et al. |
| 2006/0280193 A1 | 12/2006 | Srinivasan et al. |
| 2007/0126105 A1 | 6/2007 | Yamada et al. |

FOREIGN PATENT DOCUMENTS

| | | |
|---|---|---|
| JP | 2001-307057 | 11/2001 |
| JP | 2002-305283 | 10/2002 |
| JP | 2003-110086 | 4/2003 |
| JP | 2004-327474 | 11/2004 |
| JP | 2005-122823 | 5/2005 |
| JP | 2005-210106 | 8/2005 |

OTHER PUBLICATIONS

Taiwanese Office Action, with Japanese translation, issued in Taiwanese Patent Application No. 09820089900, dated Feb. 19, 2009.

Japanese Office Action issued in Japanese Patent Application No. JP 2005-352692, dated Sep. 21, 2010.

Japanese Office Action, with English translation, issued in Japanese Patent Application No. 2005-352692, mailed Apr. 19, 2011.

* cited by examiner

FIG.5

TRUTH TABLE OF THE 1 BIT INCREMENT CIRCIUT

| INPUT | | OUTPUT | |
|---|---|---|---|
| A | C | S | CO |
| 0 | 0 | 0 | 0 |
| 0 | 1 | 1 | 0 |
| 1 | 0 | 1 | 0 |
| 1 | 1 | 0 | 1 |

FIG.6

TRUTH TABLE OF THE INCREMENT CIRCUIT (3 BITS)

| CHIP ID NUMBER (3 BITS) | | | CALCULATED OUTPUT | | |
|---|---|---|---|---|---|
| A2 | A1 | A0 | S2 | S1 | S0 |
| 0 | 0 | 0 | 0 | 0 | 1 |
| 0 | 0 | 1 | 0 | 1 | 0 |
| 0 | 1 | 0 | 0 | 1 | 1 |
| 0 | 1 | 1 | 1 | 0 | 0 |
| 1 | 0 | 0 | 1 | 0 | 1 |
| 1 | 0 | 1 | 1 | 1 | 0 |
| 1 | 1 | 0 | 1 | 1 | 1 |
| 1 | 1 | 1 | 0 | 0 | 0 | ng # STACKED TYPE SEMICONDUCTOR MEMORY DEVICE AND CHIP SELECTION CIRCUIT

RELATED APPLICATIONS

This application is a Continuation of U.S. application Ser. No. 11/634,144, filed on Dec. 6, 2006 now U.S. Pat. No. 8,076,764, claiming priority of Japanese Patent Application No. 2005-352692, filed on Dec. 6, 2005, the entire contents of each of which are hereby incorporated by reference.

BACKGROUND OF THE INVENTION

1. Field of the Invention

This invention relates to a semiconductor device having a structure in which a plurality of semiconductor chips is stacked and a specific semiconductor chip can be selected, and particularly relates to a semiconductor device in which a unique identification number is assigned to each semiconductor chip in order to select a specific semiconductor chip.

2. Description of the Related Art

Recently, an increase in storage capacity is required for semiconductor memories such as DRAMs. Construction of the semiconductor memory using a single semiconductor chip requires finer microfabrication and the yield deteriorates. Therefore, a stacked type semiconductor device having a structure in which a plurality of semiconductor chips is stacked has been proposed. For example, by employing a 3 dimensional structure in which a plurality of semiconductor chips of the same type is stacked in multiple layers, a small stacked type semiconductor device having a large storage capacity can be realized, which can be controlled from outside in the same manner as a single DRAM.

When using such a stacked type semiconductor memory device, means for identifying each of semiconductor chips to selectively operate a specific semiconductor chip is required. Therefore, a structure is proposed, in which connection paths for selection signals applied to the semiconductor chips are formed by connecting electrodes of every semiconductor chip in the stacking order and a different selection signal is applied to each semiconductor chip through each connection path formed separately from each other so as to select a specific semiconductor chip (for example, JP-A-2002-305283). However, in such a structure, it is necessary to separately form the connection paths for the selection signals, the number of which is the same as that of stacked layers, and thus when stacking a large number of semiconductor chips, the complicated stacked structure having a large number of electrodes is needed and the production cost increases. Meanwhile, a stacked type semiconductor device is proposed, in which chip identification numbers are individually assigned to a plurality of semiconductor chips and a semiconductor chip having the identification number equal to the selection signal can be selected by assigning the chip identification numbers to the plurality of semiconductor chips individually in order to prevent the electrodes from increasing even when increasing the number of stacked layers (for example, JP-A-2003-110086). In such a stacked type semiconductor device, the connection paths can be shared among the plurality of semiconductor chips. For example, by forming N connection paths, one of $2^N$ semiconductor chips can be selected and thereby simplifying the electrode structure.

BRIEF SUMMARY OF THE INVENTION

It is an object of the present invention to provide a stacked type semiconductor memory device in which when selecting a desired semiconductor chip among a plurality of stacked semiconductor chips, a plurality of chip identification numbers different from each other can be automatically generated by a plurality of operation circuits connected in cascade, and the desired semiconductor chip can be reliably selected by a unique identification number assigned to each semiconductor chip using the semiconductor chips having the same structure without employing a complicated structure or particular control.

An aspect of the present invention is a stacked type semiconductor device having a structure in which a plurality of semiconductor chips is stacked and a desired semiconductor chip can be selected by individually assigning a plurality of chip identification numbers different from each other to said plurality of semiconductor chips comprising: a plurality of operation circuits which is connected in cascade in a stacking order of said plurality of semiconductor chips and outputs said plurality of identification numbers different from each other by performing a predetermined operation; and a plurality of comparison circuits which detects whether or not each said identification number and a chip selection address commonly connected to each said semiconductor chip are equal to each other by comparing them.

According to the aspect of the stacked type semiconductor device of the invention, in order to assign chip identification numbers different from each other to the plurality of semiconductor chips, a structure is employed in which the plurality of operation circuits is connected in cascade and a calculated output of each stage is input to a subsequent stage one after another. For example, an input value of the operation circuit of each stage is defined as the chip identification number, so that its equality with the chip selection address is detected by the comparison circuit. Thereby, for example, when the stacked type semiconductor device is turned on, a plurality of chip identification numbers are automatically generated in the plurality of operation circuits according to the connection relation, and complicated control for generating the chip identification number is not required. And, by appropriately setting a function of the operation, the plurality of identification numbers different from each other can be reliably assigned to the plurality of the semiconductor chips. Further, the plurality of the semiconductor chips may have the same structure, and the number of electrodes can be maintained small even when the number of stacked layers increases so as to realize the stacked type semiconductor device with efficient wiring and an advantage in cost.

In the present invention, both of said chip identification number and said chip selection address may be represented by a combination of N bits and M semiconductor chips to which M said identification numbers satisfying a relation of $N<M \leq 2^N$ are assigned may be stacked. By this, the number of connection paths can be suppressed to the minimum and a large number of semiconductor chips can be stacked.

In the present invention, in said M semiconductor chips, N connection paths for commonly connecting N-bit said chip selection address may be formed and N connection paths for connecting an N-bit input value and a calculated output of said operation circuit may be formed.

In the present invention, N connection paths for connecting electrodes on one side of said semiconductor chip to an input side of said operation circuit and N connecting paths for connecting an output side of said operation circuit to electrodes on an other side of said semiconductor chip may be formed.

In the present invention, said operation circuit may be an increment circuit which performs an operation of adding 1 to an input value. By this, the chip identification numbers different from each other can be reliably assigned to M semiconductor devices with a simple structure.

In the present invention, said input value of said increment circuit of a first stage among M said increment circuits connected in cascade may be set to 0 and respective input values 0 to M−1 of said M increment circuits may be sequentially assigned to said M semiconductor chips as said chip identification numbers.

In the present invention, a calculated output of an increment circuit of a last stage among M said increment circuits connected in cascade may be used to determine the number M of said semiconductor chips. By this, when the number of stacked type semiconductor devices is unknown, the correct number of semiconductor chips can be reliably recognized.

In the present invention, each said semiconductor chip may be a semiconductor memory chip for storing data.

In the present invention, each said comparison circuit may output a chip selection signal for allowing an access to a selected memory circuit of a corresponding semiconductor chip when detecting that said chip identification number is equal to said chip selection address.

In the present invention, each said semiconductor memory chip may integrally include said operation circuit and said comparison circuit in addition to said memory circuit.

In the present invention, each said semiconductor memory chip may have a same storage capacity and a same structure.

In the present invention, said semiconductor memory chip may be a DRAM chip.

Meanwhile, an aspect of the present invention is a chip selection circuit for selecting a desired semiconductor chip by individually assigning a plurality of chip identification numbers different from each other to a plurality of semiconductor chips comprising: a plurality of operation circuits which is connected in cascade in a stacking order of said plurality of semiconductor chips and outputs said plurality of identification numbers different from each other by performing a predetermined operation; and a plurality of comparison circuits which detects whether or not each said identification number and a chip selection address commonly connected to each said semiconductor chip are equal to each other by comparing them.

In the chip selection circuit of the present invention, both of said chip identification number and said chip selection address may be represented by a combination of N bits and M semiconductor chips to which M said identification numbers satisfying a relation of $N<M \le 2^N$ are assigned may be stacked.

In the chip selection circuit of the present invention, said operation circuit may be an increment circuit which performs an operation of adding 1 to an input value.

As described above, according to the present invention, in order to select a desired semiconductor chip based on chip identification numbers different from each other in a stacked type semiconductor device in which a plurality of semiconductor chips is stacked, a structure is employed in which an operation circuit and a comparison circuit are provided corresponding to each semiconductor chip, the plurality of identification numbers is generated based on a plurality of operation circuits connected in cascade, and the comparison circuit detects its equality with a common chip selection address. By employing such a structure, the chip identification numbers to be assigned to respective semiconductor chips having the same structure are automatically generated without special control, and each chip identification number is determined depending on the operation circuit so that different numbers are reliably assigned. Further, complicated electrode structure for assigning the chip identification number of each semiconductor chip is not required, and thereby realizing the stacked type semiconductor device with efficient wiring and an advantage in cost regardless of an increase in the number of stacked layers.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 5 is a truth value table of the 1-bit increment circuit of FIG. 4;

FIG. 6 is a truth value table of the increment circuit of FIG. 3;

DETAILED DESCRIPTION OF THE INVENTION

Embodiments of the invention will be described below with reference to accompanying drawings. In this embodiment, a stacked type semiconductor memory device having a plurality of stacked DRAM chips will be described as an example of a stacked type semiconductor device to which the present invention is applied.

Figure 1:
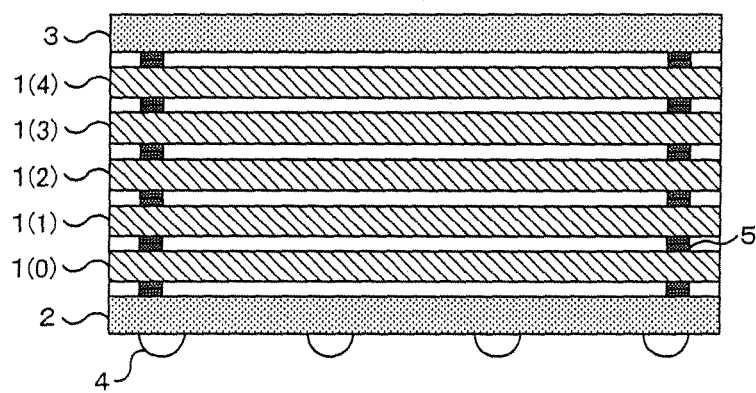
FIG. 1 is a diagram showing an example of a cross-sectional structure of a stacked type semiconductor memory device of an embodiment.

FIG. 1 is a diagram showing an example of a cross-sectional structure of the stacked type semiconductor memory device of this embodiment. The semiconductor memory device shown in FIG. 1 has a structure in which DRAM chips 1 are stacked in five layers over an interposer board 2 of the lowest layer and an interface chip 3 is stacked thereon. Respective DRAM chips 1 of the first to fifth layers are distinguished from each other by denoting numbers in parenthesis such as DRAM chip 1(0), 1(1), 1(2), 1(3), 1(4) successively.

The five-layer DRAM chips 1(0) to 1(4) have the same storage capacity and the same structure and can perform read/write operation by accessing each of them individually. Unique chip identification numbers are assigned to respective DRAM chips 1 and a DRAM chip 1 having a desired chip identification number can be selectively accessed. Each of the five-layer DRAM chips 1(0) to 1(4) is provided with a chip selection circuit for performing chip selecting operation using the chip identification number, in addition to a memory circuit. Specific configuration and operation of the chip selection circuit will be described later.

A large number of solder balls 4 as external terminals are formed on the lower surface of the interposer board 2, and the stacked type semiconductor memory device can be electrically connected to the outside through these solder balls 4.

The interface chip 3 controls input/output of signals for the five-layer DRAM chips 1(0) to 1(4). A large number of bumps 5 as electrodes are formed on the top surface and the back surface of the DRAM chip 1 and on the back surface of the interface chip 3. For each chip of the stacked type semiconductor memory device, electrical connection paths are formed through junctions between bumps 5 of adjacent chips and through an electrodes and wiring pattern of each chip. Particularly, for signals commonly connected to the DRAM chips 1(0) to 1(4), a linear connection path in vertical direction can be formed through penetrating electrodes and bumps 5 formed in each DRAM chip 1.

Although the stacked type semiconductor memory device of FIG. 1 shows a case where DRAM chips 1 are stacked in five layers, the same stack structure can be employed using a larger number of stacked layers or a smaller number of stacked layers. Even if the number of stacked layers of the stacked type semiconductor memory device increases, circuit configuration and wiring pattern of each DRAM chip 1 can be commonly used.

Figure 2:
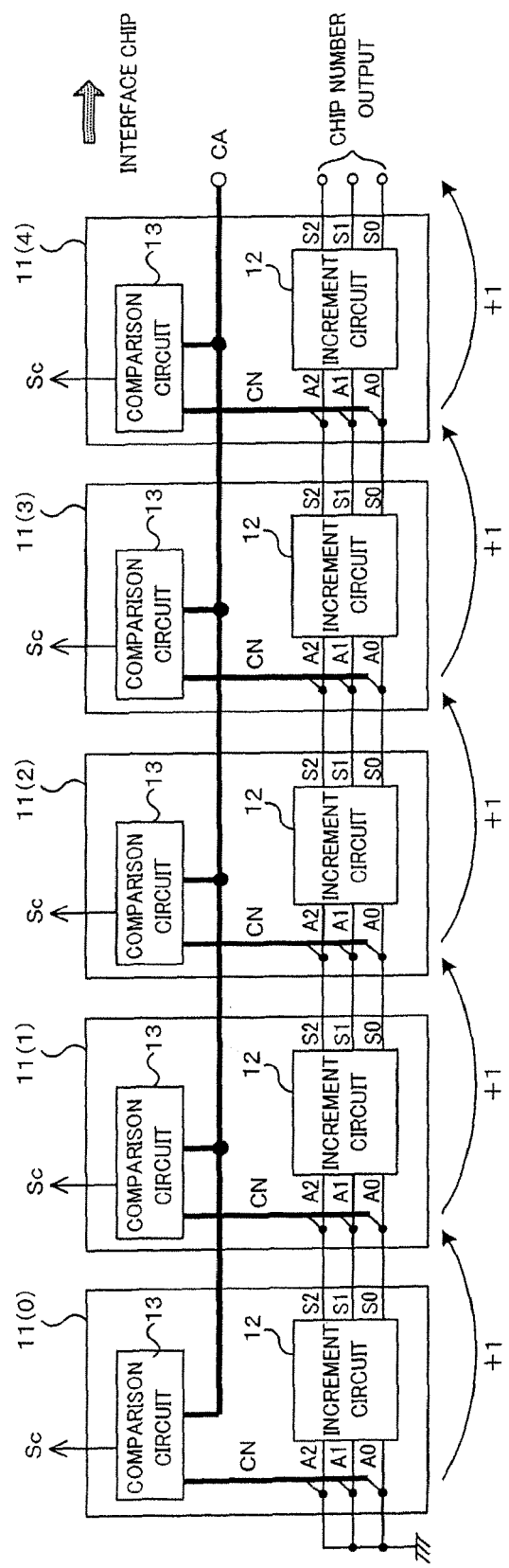
FIG. 2 is a diagram showing a configuration of chip selection circuit formed on each DRAM chip of the stacked type semiconductor memory device of this embodiment.

FIG. 2 is a diagram showing a configuration of chip selection circuits 11 formed on respective DRAM chips 1 of the stacked type semiconductor memory device of this embodiment. In FIG. 2, a configuration is shown in which five chip selection circuits 11(0) to 11(4) connected in cascade each of which is attached to each of the five-layer DRAM chips 11(0) to 11(4) of FIG. 1. Since all five chip selection circuits 11(0) to 11(4) have the same configuration, the following description will be mainly represented by an arbitrary chip selection circuit.

The chip selection circuit 11 has a function of automatically generating a chip identification number CN to be given to a corresponding DRAM chip 1 and comparing the chip identification number CN with a chip selection address CA input from outside to output a chip selection signal Sc indicating whether two signals are equal to each other. In FIG. 2, a case is shown where both the chip identification number CN and the chip selection address CA are represented by a combination of 3 bits. In order to realize such a function, the chip selection circuit 11 is composed of a 3-bit increment circuit 12 for performing an increment operation by adding 1 to the chip identification number CN as an input value, and a comparison circuit 13 for comparing the chip identification number CN with the chip selection address CA and outputting the comparison result as the chip selection signal Sc.

Here, in the first chip selection circuit 11(0) in the cascade connection, bits A0, A1 and A2 of the chip identification number CN are all connected to the ground. Thereby, an input value to the increment circuit 12 of the chip selection circuit 11(0) is set to 0, and this value is assigned as the chip identification number of the DRAM chip 1(0) of the first layer. In the second chip selection circuit 11(1), a calculated output obtained by adding 1 to the chip selection number 0 of the previous chip selection circuit 11(0) becomes an input value to the increment circuit 12, and a chip identification number 1 is assigned to the DRAM chip 1(0) of the second layer.

Subsequently, calculated outputs of the respective increment circuits 12 of the chip selection circuits 11(2), 11(3) and 11(4) is transmitted, to each of which 1 is added sequentially. Then a chip identification number 2 is assigned to the DRAM: chip 1(2) of the third layer, a chip identification number 3 is assigned to the DRAM chip 1(3) of the fourth layer, and a chip identification number 4 is assigned to the DRAM: chip 1(4) of the fifth layer. In the chip selection circuit 11(4) of the last stage, the calculated output of the increment circuit 12 becomes 5, which can be used as a number output for determining the entire number of DRAM chips 1 of the stacked type semiconductor memory device.

Figure 3:
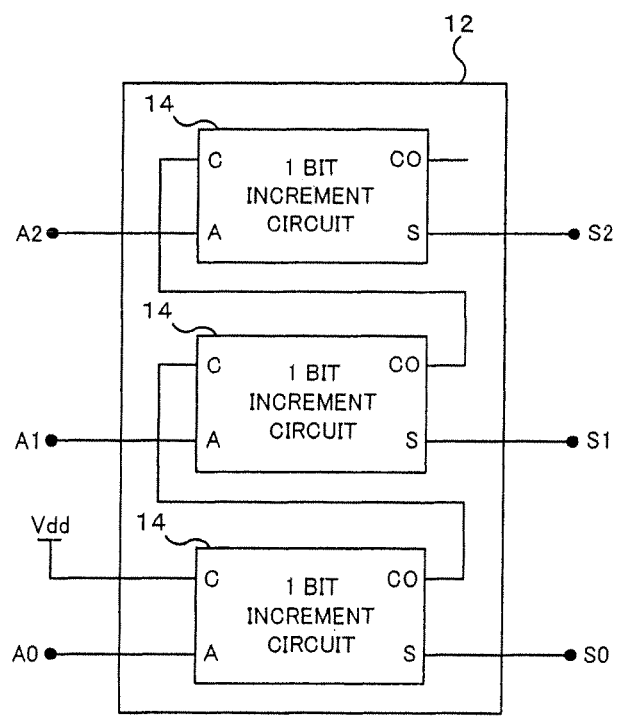
FIG. 3 is a block diagram showing a configuration of an increment circuit.
Figure 4:
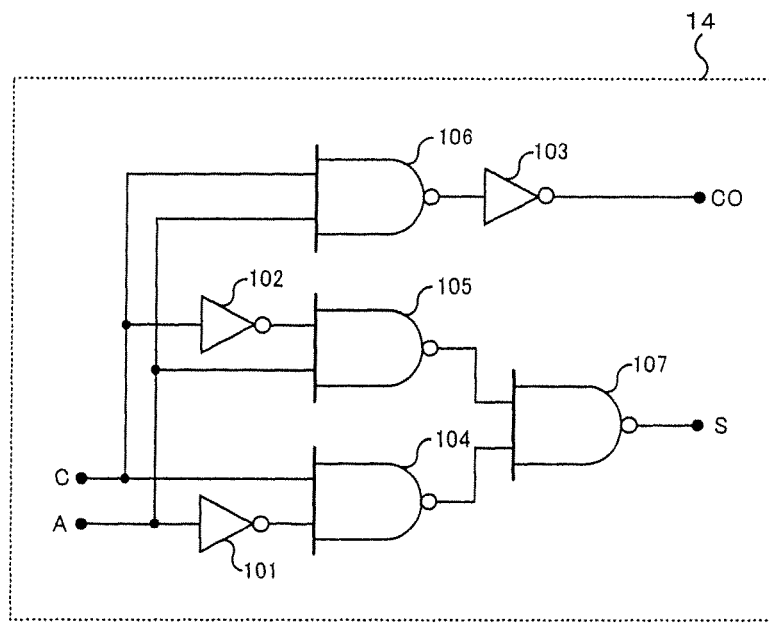
FIG. 4 is an example of a circuit configuration of a 1-bit increment circuit.

Next, configuration and operation of the increment circuit 12 included each of chip selection circuits 11(0) to 11(4) will be described using FIGS. 3 and 4. FIG. 3 is a block diagram showing a configuration of the increment circuit 12. The increment circuit 12 includes three 1-bit increment circuits 14 connected in cascade for performing an increment operation with 3 bits. FIG. 4 shows an example of a circuit configuration of the 1-bit increment circuit 14. As shown in FIG. 4, the 1-bit increment circuit 14 includes three inverters 101, 102, 103 and four NAND circuits 104, 105, 106, 107.

In FIG. 4, an input bit A and a carry C from the previous stage are input to the 1-bit increment circuit 14, and an output bit S and a carry output C0 for the subsequent stage are output. An inverted bit of the input bit A is input to one end of the NAND circuit 104 through the inverter 101 and the carry C is input to the other end thereof through the inverter 102. Outputs of two NAND circuits 104 and 105 are input to the NAND circuit 107 respectively and the output bit S is output. The input bit A is input to one end of the NAND circuit 106 and the carry C is input to the other end thereof. And an output of the NAND circuit 106 is inverted through the inverter 103 so as to be output as the carry output C0.

FIG. 5 shows a truth value table of the 1-bit increment circuit 14 of FIG. 4. As shown in FIG. 5, when the input carry C is 0, the input bit A becomes the output bit S. Meanwhile, when the input carry C is 1, the input bit A is inverted to become the output bit S. Further, only when both the input bit A and the carry C are 1, the carry output C0 becomes 1, while when either the input bit A or the carry C is 0, the carry output C0 becomes 0.

In FIG. 3, the above-mentioned 1-bit increment circuits 14 is connected in three stages, the carry output C0 of the first stage is input as the carry C of the second stage, and the carry output C0 of the second stage is input as the carry C of the third stage. And of the bits A0, A1 and A3 composing the 3-bit chip identification number CN, the bit A0 is input to the first stage, the bit A1 is input to the second stage, and the bit A2 is input to the third stage, each as the input bit A of each 1-bit increment circuit 14. Further, of the bits S0, S1 and S3 composing the 3-bit calculation output of the increment circuit 12, the bit S0 is output from the first stage, the bit S1 is output from the second stage, and the bit S2 is output from the third stage, each as the output bit S of each 1-bit increment circuit 14.

The 1-bit increment circuit 14 of the first stage is maintained at high level by connecting the carry C to a power supply Vdd. In this case, it is understood from the truth value table of FIG. 5 that the inverted bit of the bit A0 becomes the bit S0 of the calculated output. Meanwhile, in respective 1-bit increment circuits 14 of the second and third stages, a relationship between input bits A1, A2 and the calculated bits S1, S2 is determined according to the carry output C0 of the previous stage.

FIG. 6 shows a truth value table of the increment circuit 12 of FIG. 3. The 3-bit calculated output of bits S0, S1 and S2 changes as shown in FIG. 6 relative to the 3 bits A0, A1 and A2 composing the input chip identification number CN. That is, an increment operation of adding 1 to a binary value represented by A2, A1 and A0 in order from the most significant bit and outputting the calculated result as a binary value represented by S2, S1 and S0 in order from the most significant bit is performed. Outputs 001 to 111 are obtained within a range of inputs 000 to 110, while attention must be paid that the output 000 is obtained for the input 111.

The increment circuits 12 having the above-mentioned configuration vary corresponding to consecutive five lines in the truth value table of FIG. 6 by connecting five of them in cascade. In this case, in the increment circuit 12 of the DRAM chip 1(0) of the first layer, since 3 bits A0, A1 and A2 as the input value are connected to the ground, the first chip identification number CN is set to zero. Then, each previous calculated output is sequentially transmitted to become each subsequent input value between adjacent two increment circuits 12 in the stacking order of the DRAM chips 1, and each input value becomes the chip identification number CN.

Thereby, the chip identification numbers CN as input values of the five increment circuits 12 vary from 0 to 4 (from 000 to 100 in binary values) sequentially. That is, consecutive chip identification numbers 0 to 4 can be assigned to the DRAM chips 1(0) to 1(4) of the first to fifth layers respectively in the stacking order as described above. Since the chip identification number CN assigned to each of DRAM chips 1(0) to 1(4) is unique and different from each other, the chip identification number CN can be used for the purpose of selecting the desired DRAM chip 1 to be accessed as described later.

Further, as described above, the 3-bit calculated output from the increment circuit 12 attached to the DRAM chip 1(4) of the fifth layer can be used as the number output for the entire number of DRAM chips 1 stacked in the stacked type semiconductor memory device. For example, since the calculated output of the increment circuit 12 of the last stage is 5 obtained by adding 1 to 4 as the maximum chip identification number CN (S2=1, S1=0, S0=1) in the configuration of FIG. 2, it can be recognized that five DRAM chips 1 in total are stacked by referring to the number output. In addition, since the calculated output of the increment circuit 12 of the last stage is zero when eight DRAM chips 1 are stacked as described above, it is required to define that the number output of zero is recognized as eight, or it is required to detect that the carry output C0 of the increment circuit 12 of the last stage is one.

Figure 7:
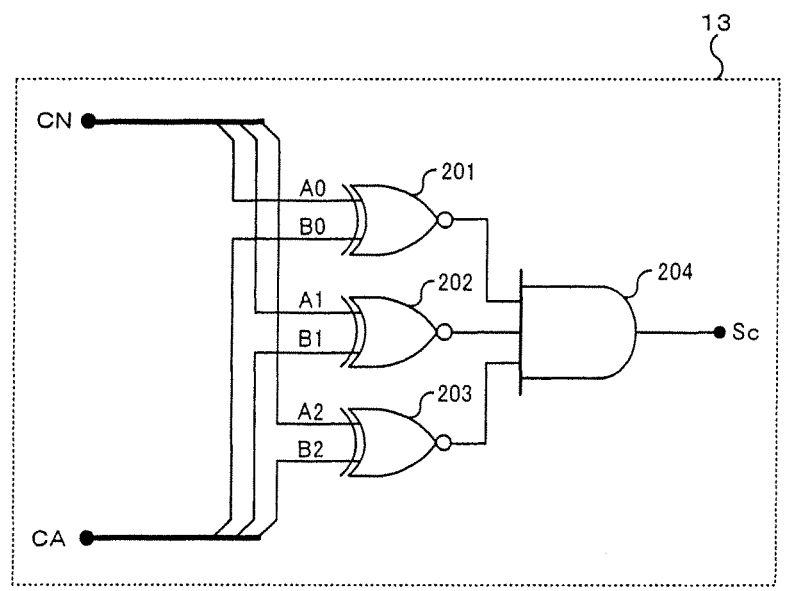
FIG. 7 is a diagram showing a configuration of a comparison circuit.

FIG. 7 is a diagram showing a configuration of the comparison circuit 13 included in each of chip selection circuits 11(0) to 11(4) of FIG. 2. As shown in FIG. 7, the comparison circuit 13 includes three EX-OR circuits 201, 202, 203, and an AND circuit 204. In such a configuration, the chip identification number CN assigned to itself is compared with the common chip selection address CA input from the outside through the interface chip 3.

In FIG. 7, bit A0 of the chip identification number CN and bit B0 of the chip selection address CA are input to the EX-OR circuit 201. Bit A1 of the chip identification number CN and bit B1 of the chip selection address CA are input to the EX-OR circuit 202. Bit A2 of the chip identification number CN and bit B2 of the chip selection address CA are input to the EX-OR circuit 203. Each of EX-OR circuits 201, 202 and 203 is a circuit for detecting whether the input two bits are equal or not and outputting 0 when the two bits are not equal while outputting 1 when the two bits are equal.

Respective outputs of the three EX-OR circuits 201, 202 and 203 are input to the AND circuit 204, and the calculated output thereof are output as the chip selection signal Sc. Thus, when detecting equality in all three outputs of EX-OR circuits 201, 202 and 203, the output of the AND circuit 204 becomes 1 and the chip selection signal Sc becomes high level. Meanwhile, when either output of the EX-OR circuits 201, 202 or 203 is detected not equal, the output of the AND circuit 204 becomes 0 and the chip selection signal Sc becomes low level. In this manner, one of DRAM chips 1 to which the desired chip identification number CN is given can be selected based on the chip selection signal Sc.

In FIG. 2, each chip selection signal Sc output from each comparison circuit 13 of five chip selection circuits 11(0) to 11(4) is supplied to a corresponding memory circuit (not shown) of each of the DRAM chips 1(0) to 1(4), and each read/write operation is permitted when the chip selection signal Sc is high level. An external controller can selectively operate DRAM chips 1(0) to 1(4) to be accessed by attaching the chip selection address CA to various control commands such as read and write commands.

Although in the configuration of FIG. 2, the first chip identification number CN becomes 0 by setting the input value to the increment circuit 12 of the DRAM chip 1(0) of the first layer to 0, the first chip identification number CN can be changed within a range of 1 to 3. For example, of the 3-bit input value of the increment circuit 12 of the DRAM chip 1(0), bits A0 and A1 are connected to the power supply and bit A2 is connected the ground, so that the first chip identification number CN can be set to 3. In this case, the chip identification numbers CN within a range of 3 to 7 are assigned to the five-layer DRAM chips 1(0) to 1(4). However, attention must be paid that the number output from the chip selection circuit 11(4) of the last stage does not reflect the entire number of DRAM chips 1 of the stacked type semiconductor memory device.

By employing the above-mentioned configuration, when the stacked type semiconductor memory device of this embodiment is turned on, five chip identification numbers CN to be given to the DRAM chips 1(0) to 1(4) of five layers can be automatically generated. At this time, complicated control for generating the chip identification numbers CN is not required, and the assigned chip identification number CN can be continuously used. Further, since function of the increment circuit 12 is utilized without utilizing fluctuations in manufacturing process in order to obtain the chip identification numbers CN to be assigned to the DRAM chips 1, the chip identification numbers CN different from each other can be reliably obtained.

Here, in the configuration of FIG. 2, since a range of 0 to 7 can be represented by the 3-bit chip identification number CN, the available maximum number of DRAM chips 1 is eight. However, when using more DRAM chips 1, it is required to increase the number of bits of the chip identification number CN and the chip selection address CA, and at the same time the increment circuit 12 and the comparison circuit 13 need to be configured corresponding to a large number of bits. For example, if the chip identification number CN and the chip selection address CA are represented by a combination of N bits, the number M of stacked layers of DRAM chips 1 can be freely set within a range below $2^N$.

Although a case has been described in which the increment circuit 12 for performing the increment operation for the chip identification number CN, other operation circuits can be used instead of the increment circuit 12. For example, a decrement circuit for performing a decrement operation for the input identification number CN. In this case, by replacing all the five increment circuits 12 with the decrement circuits in the configuration of FIG. 2, for example, identification numbers CN which decrease in the order of 4, 3, 2, 1, 0 can be assigned to the DRAM chips 1(0) to 1(4). In addition, the first chip identification number CN is set to a predetermined number equal to or more than 4, and the predetermined number can be set by appropriately adjusting the connections of bits A0, A1 and A2 in the DRAM chip 1(0) of the first layer.

In this embodiment, the operation circuit replacing the increment circuit 12 of FIG. 2 may have a calculating function which can output five different values in a predetermined order among values 0 to 7 being represented by the 3-bit chip identification number CN. Thus, not only the increment circuits or the decrement circuits in which calculated values change one by one in response to their order, but also operation circuits in which calculated values change randomly in response to their order can be used.

A specific example of such an operation circuit may perform an operation using linear combination method which is one of random number generation algorithms. For example, on the promise that eight DRAM chips 1 are used, when an input corresponding to the 3-bit chip identification number CN is denoted A and a 3-bit calculated output is denoted S, the operation circuit performing an operation expressed as following equation (1) can be used.

$$S=(A\times 226954771+1) \bmod 8 \quad (1)$$

In the equation (1), "mod" represents an operator for calculating a remainder. When using the operation circuit to actually calculate the equation (1), the calculated outputs change in the order of 1, 6, 7, 4, 5, 2, 3, 0, and these values can be assigned to the DRAM chips 1 sequentially as the chip identification numbers CN. Although, the operation circuit which calculates the equation (1) has a more complicated circuit configuration than that of the increment circuit 12, the operation circuit can be configured using a combination of well-known logic circuits.

Figure 8:
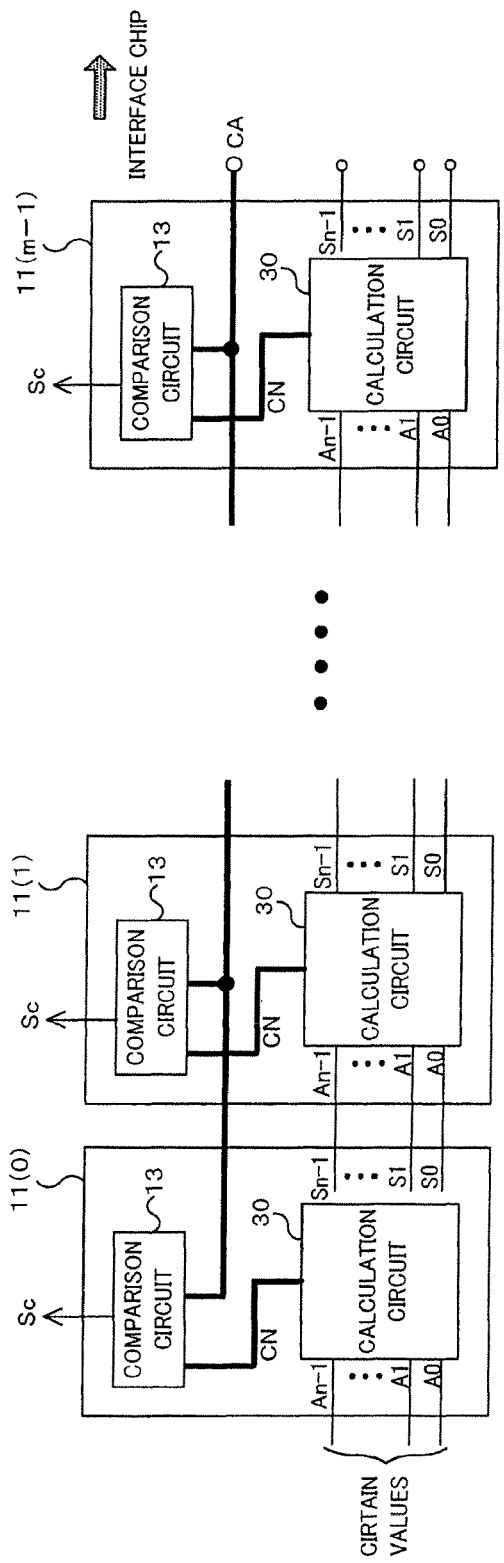
FIG. 8 is a block diagram representing a generalized configuration including a plurality of chip selection circuits connected as in FIG. 2.

FIG. 8 is a block diagram representing a generalized configuration including a plurality of chip selection circuits 11 connected as in FIG. 2. In FIG. 8, a configuration is shown in which m chip selection circuits 11(0) to 11($m-1$) formed on respective DRAM chips 1(0) to 1($m-1$) of the m layers are connected in cascade. Each chip selection circuit 11 of FIG. 8 includes an operation circuit 30 for performing the above described operation instead of the increment circuit 12 of FIG. 2. And the chip identification number CN and the chip selection address CA are both represented by n bits. Thus, m operation circuits 30 connected in cascade perform the operation using the bits A0 to An−1 as input values and output bits S0 to Sn−1 as calculated outputs. Further, each of m comparison circuits 13 to which bits B0 to Bn−1 of the chip selection address CA are input in addition to the above-mentioned chip identification number CN compares them and outputs the chip selection signal Sc when detecting equality of each of all the n bits. As described above, the maximum number m of stacked layers of the DRAM chips 1 is $2^n$, and a relation of m≤$2^n$ needs to be satisfied. Further, in order to simplify the stacked structure in comparison with the conventional configuration (for example, refer to JP-A-2002-305283), at least a relation of n<M needs to be satisfied.

Although in FIG. 8, the n-bit chip identification number CN is output from each operation circuit 30, the configuration is not limited to a case in which the input value of bits A0 to An−1 to the operation circuit 30 as shown in FIG. 2. For example, not only the input value of bits A0 to An−1, but also the calculated output of bits S0 to Sn−1 can be used as the chip selection number CN. For another example, by performing predetermined conversion (for example, adding 1) of the input value of bits A0 to An−1 or the operation output of bits S0 to Sn−1, the converted value can be used as the chip selection number CN.

Figure 9:
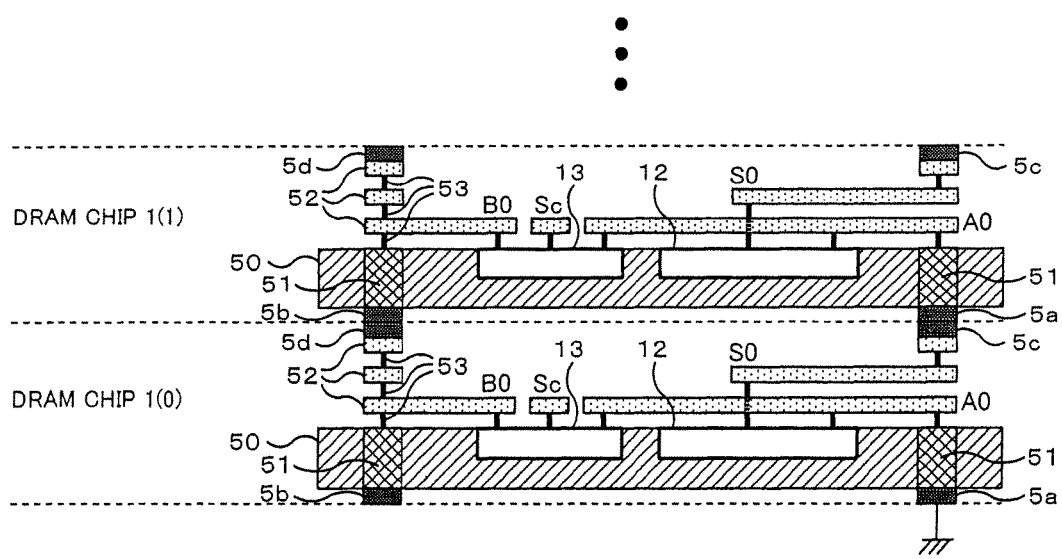
FIG. 9 is a diagram schematically showing cross-sectional structure of a region including two adjacent DRAM chips in the stacked type semiconductor device of FIG. 1.

Next, connection structure between the DRAM chips 1 of the stacked type semiconductor device will be described. FIG. 9 is a diagram schematically showing cross-sectional structure of a region including two adjacent DRAM chips 1 in the stacked type semiconductor device of FIG. 1. Although, the region including the DRAM chip 1(0) of the first layer and the DRAM chip 1(1) of the second layers is shown in FIG. 9, the description based on FIG. 9 is common to all the DRAM chips 1(0) to 1(4) of respective layers having basically the same structure.

As shown in FIG. 9, in the DRAM chip 1, the above-mentioned increment circuit 12 and comparison circuit 13 are formed on a semiconductor substrate 50. Bumps 5 (5a, 5b, 5c and 5d) are formed on upper and lower surfaces of the semiconductor substrate 50. Connection paths for connecting the chip identification number CN and the chip selection address CA are formed through the DRAM chip 1 and the bumps 5. Further, in the DRAM chip 1, penetrating electrodes 51 through the semiconductor substrate 50, multiple aluminum wiring layers 52 formed over the semiconductor substrate 50, and a large number of through holes 53 through insulating films between the aluminum wiring layers 52 are formed. Although the connection paths regarding the bit A0 of the chip identification number CN, the bit B0 of the chip selection address CA and the bit S0 of the calculated output are shown in the connection structure of FIG. 9, connection paths regarding other bits A1, A2, B1, B2, S1 and S2 have the same structure.

A connection path through one bump 5a on the lower side, the penetrating electrodes 51, the through holes 53 and the aluminum wiring layers 52 to the input side of the increment circuit 12 is formed for the bit A0. A connection path through the aluminum wiring layers 52, the through holes 53 and one bump 5c on the upper side to the bump 5a on the lower side of the DRAM chip 1 of the upper layer is formed for the bit S0 of the calculated output of the increment circuit 12 so as to be sent to the DRAM: chip 1 of the upper layer. Meanwhile, a connection path through one bump 5b on the lower side, the penetrating electrodes 51, the through holes 53 and the aluminum wiring layers 52 to one bump 5d on the upper side is formed for the bit B0, and this connection path branches at a predetermined position so as to be connected to the comparison circuit 13 through the through holes 53. Wiring patterns for the chip selection signal Sc output from the comparison circuit 13 are connected to a memory circuit (not shown) through the through holes 53 and the aluminum wiring layers 52.

It is apparent from the connection structure of FIG. 9 that a nearly straight-line connection path for vertical connection in the stacked type semiconductor device is formed. As a contrast, regarding the bits A0, A1 and A2 corresponding to the chip identification number CN and the bits S0, S1 and S2 corresponding to the calculated output, a structure is formed in which the penetrating electrodes 51, the through holes 53, the aluminum wiring layers 52 and the increment circuit 12 of respective layers of the stacked type semiconductor device are connected sequentially. In addition, the connection paths for the chip selection address CA, the chip identification number CN and the calculated output can be formed in the same structure in all the semiconductor chips 1.

If the conventional structure in which connection paths are formed separately for each DRAM chip 1 is employed regarding the chip identification number CN, straight-line connection paths need to be formed in the same manner as for the chip selection address CA and the number of the connection paths should be at least the number of stacked layers of the DRAM chips 1, so that the wiring structure is extremely complicated. As a contrast, in this embodiment, the connection structure is employed in which the chip identification number CN is transmitted between the adjacent DRAM chips 1. Therefore, even when the number of stacked layers increases, the number of connection paths is not required to be increased correspondingly, and thereby simplifying the wiring structure.

Although a case is shown in which the chip selection circuit 11 including the increment circuit 12 and the comparison circuit 13 is provided integrally in addition to the memory circuit in the single semiconductor chip 11 of this embodiment, the chip selection circuit 11 corresponding to each semiconductor chip 1 may be formed on a different chip from the semiconductor chip 1.

Although the present invention have been specifically described above based on this embodiment, the present invention is not limited to this embodiment described above, and the various changes and modification can be made without departing from the spirit and scope of the present invention. For example, although the stacked type semiconductor chip on which a plurality of DRAM chips 1 is stacked is described, the present invention is widely applicable to a stacked type semiconductor device on which various semiconductor memory chips are stacked as well as DRAM chips. And, the present invention is widely applicable to the entire stacked type semiconductor devices on which various semiconductor chips are stacked as well as semiconductor memory chips. Further, the structure of the chip selection circuit 11 of this embodiment can be applied to a semiconductor device on which a plurality of semiconductor chips are arranged in plane as well as the stacked type semiconductor device.

The present invention is not limited to the above described embodiments, and various variations and modifications may be possible without departing from the scope of the present invention.

This application is based on the Japanese Patent application No. 2005-352692 filed on Dec. 6, 2005, entire content of which is expressly incorporated by reference herein.

What is claimed is:

1. A method comprising:
providing a plurality of semiconductor chips, each of the semiconductor chips comprising:
a semiconductor substrate, made of a semiconductor material, including a first main surface and a second main surface opposite to the first main surface,
a set of penetration electrodes, each of the penetration electrodes penetrating the semiconductor substrate from the first main surface to the second main surface and including a first end portion on a side of the first main surface and a second end portion on a side of the second main surface,
a set of surface electrodes formed on the side of the first surface of the semiconductor substrate, and
an operation circuit formed on the side of the first main surface of the semiconductor substrate and coupled between the first end portion of the set of penetration electrodes and the set of surface electrodes; and
stacking the plurality of semiconductor chips with one another to provide a chip stack structure in which the set of surface electrodes of one of adjacent two of the semiconductor chips is vertically aligned with and electrically connected to the second end portion of the set of penetration electrodes of the other of the adjacent two of the semiconductor chips,
wherein each of the semiconductor chips is provided to further comprise:
a set of additional penetration electrodes each penetrating the semiconductor substrate from the first main surface to the second main surface, and
a comparison circuit formed on the side of the first main surface of the semiconductor substrate, the comparison circuit being electrically connected to the set of penetrating electrodes and the set of additional penetration electrodes to compare first information from the set of penetration electrodes with second information from the set of additional penetration electrodes; and
wherein the stacking the plurality of semiconductor chips comprises vertically aligning and electrically connecting the set of additional penetration electrodes of the one of the adjacent two of the semiconductor chips with and to the set of additional penetration electrodes of the other of the adjacent two of the semiconductor chips.

2. The method as claimed in claim 1, wherein each of the semiconductor chips is provided such that
the operation circuit is electrically coupled between the first end portion of the set of penetration electrodes and the set of surface electrodes via a set of wiring layers each extending substantially parallel to the first main surface of the semiconductor substrate.

3. The method as claimed in claim 2, wherein the operation circuit of each of the semiconductor chips includes a set of input nodes coupled to the first end portion of the set of penetration electrodes via a first part of the set of wiring layers and a set of output nodes coupled to the set of surface electrodes via a second part of the set wiring layers.

4. The method as claimed in claim 2, wherein each of the semiconductor chips is provided to further comprise:
a first set of through holes each penetrating the insulating film to connect an associated one of the wiring layers and the first end portion of an associated penetration electrode of the set of penetration electrodes, and
a second set of through holes each penetrating the insulating film to connect an associated one of the wiring layers and an associated surface electrode of the set of surface electrodes.

5. The method as claimed in claim 4,
wherein each of the semiconductor chips is provided to further comprise a multi-level wiring structure including a low-level wiring layer and an upper-level wiring layer over the lower-level wiring layer; and
wherein the set of wiring layers comprises:
a plurality of first wirings each formed as the lower-level wiring layer to electrically connect the operation circuit to the first end portion of the set of penetrating electrodes, and
a plurality of second wirings each formed as the upper-level wiring layer to electrically connect the operation circuit to set of surface electrodes.

6. The method as claimed in claim 5, wherein the multi-level wiring structure further includes a first interlayer insulating layer between the lower-level wiring layer and the upper-level wiring layer, and the first interlayer insulating layer serving as the insulating film intervening between the set of surface electrodes and the first end portion of the set of penetrating electrodes.

7. The method as claimed in claim 6, wherein the multi-level wiring structure further includes:
second and third interlayer insulating layers, the lower-level wiring layer being between the first and second interlayer insulating layers and the upper-level wiring layer being between the first and third interlayer insulating layers;
a plurality of first through holes each penetrating the second interlayer insulating film to connect the first end portion of an associated one of the penetrating electrodes and an associated one of the first wiring; and a plurality of second through holes each penetrating the third interlayer insulating film to connect an associated one of the surface electrodes and an associated one of the second wirings.

8. The method as claimed in claim 1, further comprising: controlling one of the semiconductor chips positioning at respective ends of the chip stack structure so that the operation circuit of the one of the semiconductor chips positioning at the respective ends of the chip stack structure produces information that is to be referred by the operation circuit of each of the remaining semiconductor chips of the chip stack structure.

9. The method as claimed in claim 1, wherein the method further comprises supplying chip select information to the set of penetration electrodes of at least one of the semiconductor chips to activate one of the semiconductor chips.

10. The method as claimed in claim 1, wherein each of the semiconductor chips is provided such that the operation circuit responds to first information at one of the first end portion of the set of penetration electrodes and the set of surface electrodes to produce second information and outputs the second information to the other of the first end portion of the set of penetration electrodes and the set of surface electrodes.

11. The method as claimed in claim 10, wherein the first information is configured to serve as first chip identification information for its own semiconductor chip and the second information is configured to serve as second chip identification information for another semiconductor chip.

* * * * *